(12) United States Patent
Tsang

(10) Patent No.: US 6,870,760 B2
(45) Date of Patent: Mar. 22, 2005

(54) METHOD AND SYSTEM FOR PERFORMING READOUT UTILIZING A SELF REFERENCE SCHEME

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/688,290

(22) Filed: Oct. 16, 2003

(65) Prior Publication Data
US 2004/0165420 A1 Aug. 26, 2004

Related U.S. Application Data

(60) Provisional application No. 60/448,887, filed on Feb. 24, 2003.

(51) Int. Cl.[7] .............................................. G11C 11/00
(52) U.S. Cl. ........................................ 365/158; 365/50
(58) Field of Search .................................... 365/158, 50

(56) References Cited

U.S. PATENT DOCUMENTS 6,365,286 B1 * 4/2002 Inomata et al. ............. 428/692

* cited by examiner

Primary Examiner—M. Tran
(74) Attorney, Agent, or Firm—Sawyer Law Group LLP

(57) ABSTRACT

A method and system for reading a magnetic memory including a plurality of magnetic elements is disclosed. The method and system include determining a first resistance of at least one of the plurality of magnetic elements. The method and system also include applying a disturb magnetic field to the magnetic element(s) and determining a second resistance of the magnetic element(s) while the disturb magnetic field is applied. The method and system further include comparing the first resistance to the second resistance. Consequently, the state(s) of the magnetic element(s) can be determined without the use of a separate reference element.

18 Claims, 3 Drawing Sheets

METHOD AND SYSTEM FOR PERFORMING READOUT UTILIZING A SELF REFERENCE SCHEME

CROSS-REFERENCE TO RELATED APPLICATIONS

This application is claiming under 35 USC 119(e) the benefit of provisional patent application Ser. No. 60/448,887 filed on Feb. 24, 2003.

FIELD OF THE INVENTION

The present invention pertains to reading nonvolatile magnetic memories, such as a magnetic random access memory (MRAM), and more particularly to a method and system for more reliably reading information stored in a magnetic memory in the presence of variations in element resistance and signal level.

BACKGROUND OF THE INVENTION

DRAM, FLASH, and SRAM are the three major conventional semiconductor memories on the market. The manufacturing cost of DRAM is the lowest. However, in addition to shortcomings such as the need for refreshment, relatively low speed and high power consumption, DRAM is volatile. Consequently, a DRAM loses data when the power is turned off. FLASH memory is non-volatility, but is very slow. The write cycle endurance for a FLASH memory is less than one million cycles. This write cycle endurance limits the application of FLASH memories in some high data rate market. SRAM is a fast memory. However, SRAM is volatile and takes too much silicon area per cell. In search of a universal random access memory that offers high speed, non-volatility, small cell area, and good endurance, many companies are developing thin film Magnetic Random Access Memories (MRAM).

Conventional MRAMs can be fabricated with a memory cells using a variety of magnetic elements, such as an Anisotropic Magnetoresistance (AMR) element, a Giant Magnetoresistance (GMR) element, and a Magnetic Tunneling Junction (MTJ) stack. For example, a conventional MTJ stack is relatively simple to manufacture and use. Consequently, an MRAM is used as the primary example herein.

The magnetic field for changing the orientation of the changeable magnetic vector is usually supplied by two conductive lines that are substantially orthogonal to each other. When electrical current passes through the two conductive lines at the same time, two magnetic fields associated with the current in the two conductive lines act on the changeable magnetic vector to orient its direction.

FIG. 1A depicts a portion of a conventional MRAM 1. The conventional MRAM includes conventional orthogonal conductive lines 10 and 12, conventional magnetic storage cell having a MTJ 30 and conventional transistor 13. In some designs, the conventional transistor 13 is replaced by a diode, or completely omitted, with the conventional MTJ cell 30 in direct contact with the conventional word line 10. The conventional MRAM 1 utilizes a conventional magnetic tunneling junction (MTJ) stack 30 as a memory cell. Use of a conventional MTJ stack 30 makes it possible to design an MRAM cell with high integration density, high speed, low read power, and soft error rate (SER) immunity. The conductive lines 10 and 12 are used for writing data into the magnetic storage device 30. The MTJ stack 30 is located on the intersection of and between conventional conductive lines 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Layer 32 is usually a composite of seed layers and an antiferromagnetic (AFM) layer that is strongly coupled to the pinned magnetic layer. The AFM layer included in the layers 32 is usually Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction.

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

FIG. 1B depicts a conventional method 50 for reading data from the conventional MRAM 1. The method 50 is depicted in the context of FIG. 1A. Referring to FIGS. 1A and 1B, during reading, the conventional transistor 13 is turned on so that a small tunneling current can flow through the conventional MTJ stack 30, via step 52. A current is provided and passed through the MTJ 30 stack, via step 54. Thus, the current passes from one magnetic layer 34 or 38 to the other magnetic layer 38 or 34, respectively. The resistance of the MTJ stack 30 is determined, via step 56. The resistance of the MTJ stack 30 can be determined in step 56 by measuring the voltage across the MTJ stack 30 for the current provided in step 54. Alternatively, the voltage across the MTJ stack can be set and the current through the MTJ measured in step 56. The resistance of a separate reference element is determined, via step 58. Preferably, the separate reference element has a magnitude that is the average of the high resistance and the low resistance of the MTJ stack 30. Typically, the resistance of the separate reference element is between the resistances of the high and low resistance states of the MTJ stack 30. Note that for clarity, the separate reference element is omitted from the MRAM 1. However, the separate reference element typically resides in a separate location and is isolated from each of the MTJ stacks, such as the MTJ stack 30. Based on the resistance of the MTJ stack 30 and the resistance of the separate reference element, the state of the MTJ stack 30 is determined, via step 60. In particular, if the resistance of the MTJ stack 30 is lower than the resistance of the separate reference element, then the MTJ stack 30 is determined to be in the low resistance state. If the resistance of the MTJ stack 30 is higher than the resistance of the separate reference element, then the MTJ stack 30 is determined to be in the high resistance state. Step 60, therefore, compares the resistance of the MTJ stack 30 to the resistance of the separate reference element. Thus, it can be determined whether the MTJ stack 30 stores a zero or a one.

Although the conventional method 50 functions in principle, one of ordinary skill in the art will readily recognize that in practical applications, the signal level (the difference in the resistance between the low resistance state and the high resistance state) should be larger than the variations of resistance variations among the data cells, relative to the separate reference element. As the size of memory cell and, therefore, the MTJ stack 30, scales down, and the tunneling layer 36 in the MTJ stack 30 becomes thinner, variations in resistance among the MTJ stacks 30 adversely affect the ability of the conventional method 50 to adequately distinguish between the low and high resistance states of the MTJ stack 30. Thus, the conventional method 50 poses read-back reliability challenges for MRAM scalability.

Accordingly, what is needed is a method and system for providing a read scheme having improved reliability and reduced susceptibility to variations among storage elements. The present invention addresses such a need.

SUMMARY OF THE INVENTION

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

According to the system and method disclosed herein, the present invention provides a method for reading a magnetic memory and the magnetic memory that can be read without the use of separate reference element(s). As a result, reliability of the read operation can be improved.

DETAILED DESCRIPTION OF THE INVENTION

Figure 1A:
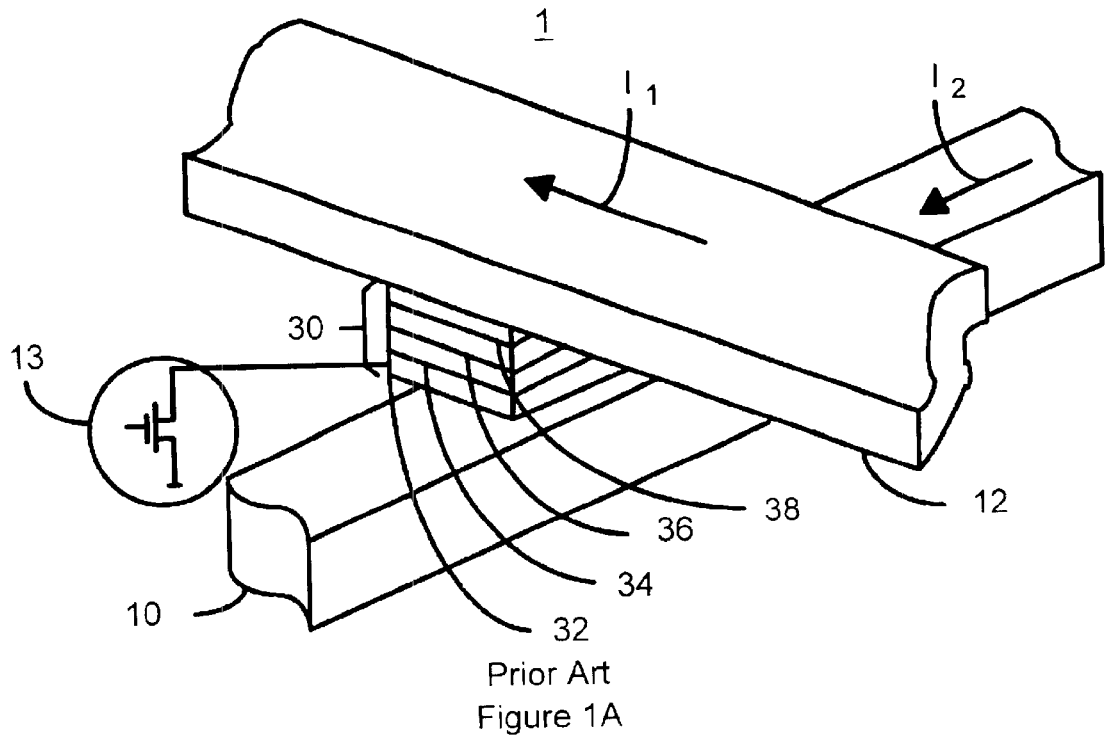
FIG. 1A is a three-dimensional view of a portion of a conventional magnetic memory including a MTJ cell, located at the intersection of a bit line and a word line.
Figure 1B:
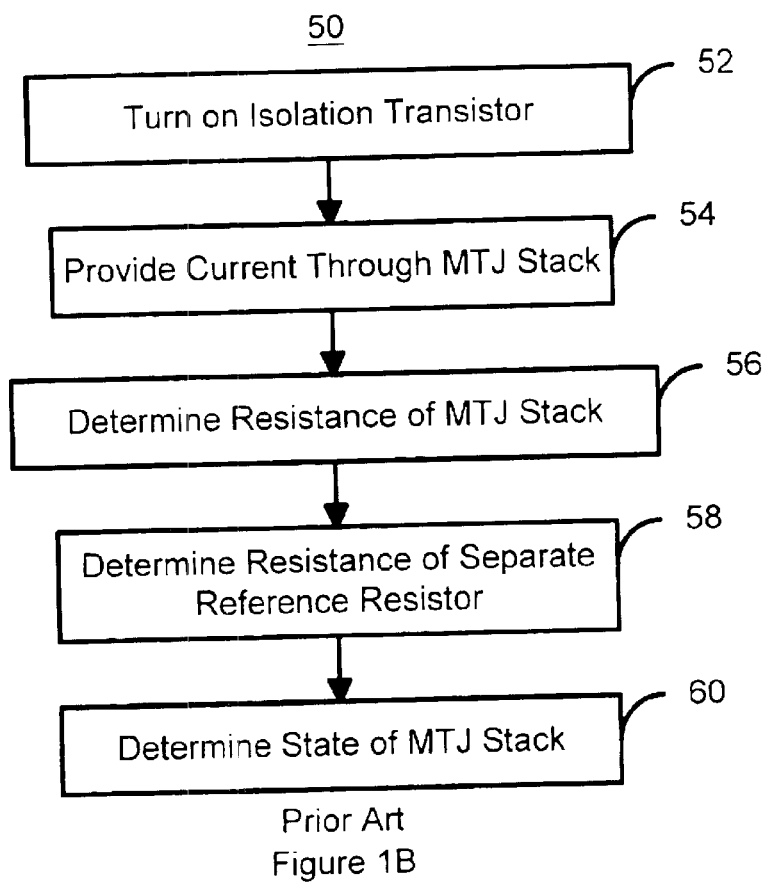
FIG. 1B is a high-level flow chart of a conventional method for providing an MTJ stack in a conventional magnetic memory.

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

The present invention provides method and system for providing a magnetic memory. The method and system comprise providing a plurality of magnetic elements and a plurality of reference layers. Each of the plurality of magnetic elements includes a free layer and a spacer layer. Each of the plurality of reference layers is coupled with a corresponding portion of the plurality of magnetic elements. The plurality of reference layers is ferromagnetic. A portion of each of the plurality of reference layers functions as at least a portion of a pinned layer for each of the corresponding portion of the plurality of magnetic elements. The portion of each of the plurality of reference layers also functions as a write line for the corresponding portion of the plurality of magnetic elements. The spacer layer resides between the free layer of each of the plurality of magnetic elements and the reference layer.

The present invention will be described in terms of particular types of magnetic memory cells, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices. For example, although certain magnetic tunneling junction (MTJ) stacks are described, nothing prevents the use of other materials, other alloys and synthetic layers, or other magnetic elements. In addition, although the present invention is described in the context of metal-oxide-semiconductor (MOS) devices and MTJ stacks, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described in the conjunction of certain other components, such as word and bit lines, having certain materials and locations. However, one of ordinary skill in the art will readily recognize that other components and/or components having different locations not inconsistent with the present invention can be used. Moreover, the present invention is described in the context of a single MTJ stack, a single bit line, and a single word line. However, one of ordinary skill in the art will readily recognize that the method and system apply to and operate effectively for systems having multiple magnetic elements, multiple bit lines, and multiple word lines.

Figure 2:
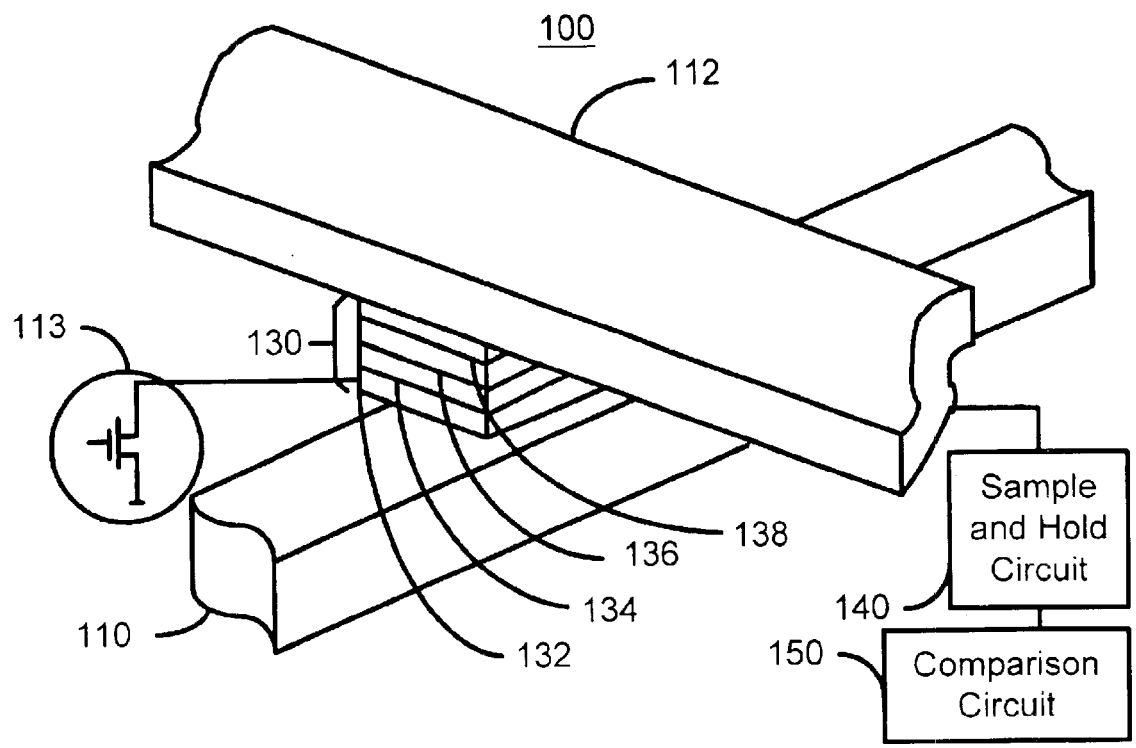
FIG. 2 depicts a three-dimensional view of one embodiment of a magnetic memory in accordance with the present invention.

To more particularly illustrate the method and system in accordance with the present invention, refer now to FIG. 2, depicting a three-dimensional view of one embodiment of a magnetic memory 100 in accordance with the present invention. For clarity, the portions of the MRAM 100 that are analogous to the MRAM 1 are labeled similarly. Thus, the MRAM 100 includes conductive lines 110 and 112 that are preferably orthogonal, a magnetic storage cell preferably including a MTJ stack 130 and a transistor 113. In some embodiments, the transistor 113 can be replaced by a diode, or completely omitted, with the MTJ stack 130 in direct contact with the word line 110. The MRAM 100 utilizes a MTJ stack 130 in a memory cell. In addition, in a preferred embodiment, the MRAM 100 includes a sample and hold circuit 140 and a comparison circuit 150. However, in an alternate embodiment, other and/or additional component(s) can be used to perform the functions of the circuits 140 and 150.

The conductive lines 110 and 112 are used for writing data into the MTJ stack 30. The MTJ stack 30 is located on the intersection of and between the conductive lines 110 and 120. The conductive line 110 and line 120 are referred to as the word line 110 and the bit line 120, respectively. The names, however, are interchangeable. Other names may also be used.

The MTJ stack 130 primarily includes a free layer 138 with a changeable magnetic vector (not explicitly shown), a pinned layer 134 with a fixed magnetic vector (not explicitly shown), and an insulator 136 in between the two magnetic layers 134 and 138. The insulator 136 typically has a thickness that is low enough to allow tunneling of charge carriers between the magnetic layers 134 and 138. The layer 132 preferably includes seed layer(s) and an AFM layer that is strongly coupled to the pinned layer 134. The AFM layer included in the layers 132 is preferably Mn alloy, such as IrMn, NiMn, PdMn, PtMn, CrPtMn, and so on. The AFM layer is typically strongly exchanged coupled to the pinned layer 134 to ensure that the magnetic vector of the pinned layer 134 is strongly pinned in a particular direction.

Data are preferably written to the MTJ stack 130 in a conventional manner. Thus, at equilibrium, after the data writing process is completed, the MTJ stack 130 is either in the low resistance state (magnetic vectors of the free layer 138 and pinned layer 134 parallel) or in the high resistance state (magnetic vectors of the free layer 138 and pinned layer 134 antiparallel). However, data are read from the MTJ stack 130 in a different manner.

In order to read data from the MTJ stack 130, the sample and hold circuit 140 and the comparison circuit 140 are preferably used. In an alternate embodiment, one or more different circuit(s) performing analogous function(s) could be used. The sample and hold circuit 140 is used in reading the MTJ stack 130, as well as other MTJ stacks (not shown). The sample and hold circuit 140 is used to sample the resistance of the MTJ stack 130 and hold the resistance for comparison. In particular, the sample and hold circuit 140 is used to sample the resistance of the MTJ stack 130 in its equilibrium state (with simply a current provided through the MTJ stack 130) and to sample the resistance of the MTJ stack 130 with it magnetic vector perturbed from equilibrium (using a disturb magnetic field applied to the MTJ stack 130), as described below. The comparison circuit 150 is used to compare the data during equilibrium to the data obtained while the disturb magnetic field is applied.

Figure 3:
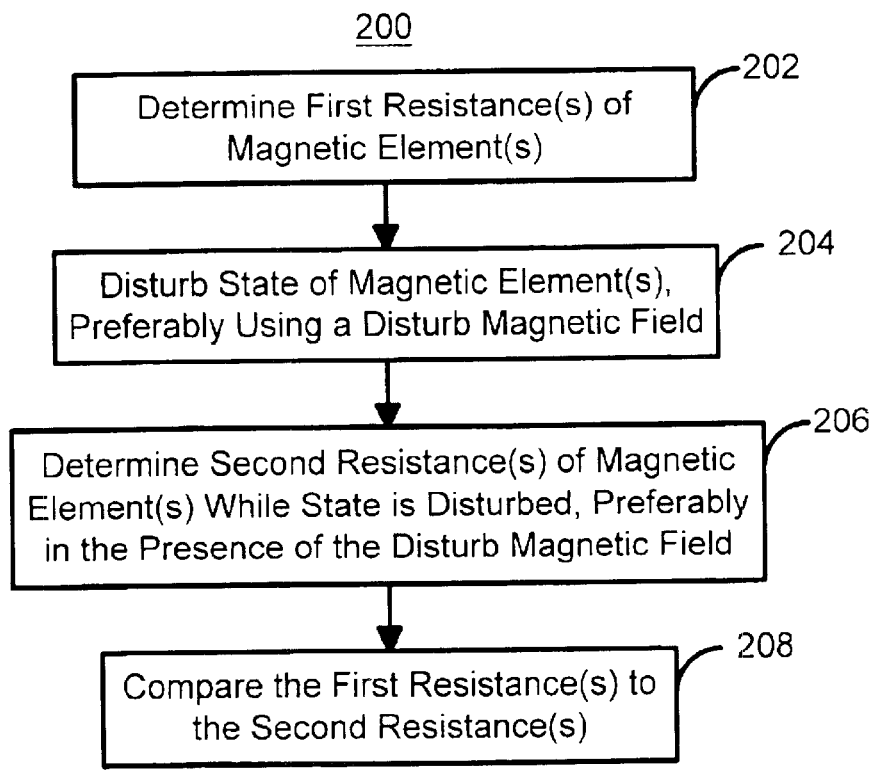
FIG. 3 depicts a high-level flow chart of one embodiment of a method for providing the first embodiment of a magnetic memory in accordance with the present invention.

FIG. 3 depicts a high-level flow chart of one embodiment of a method 200 for providing the first embodiment of a magnetic memory in accordance with the present invention. The method 200 is described in conjunction with the MRAM 100 depicted in FIG. 2. The method 200 is also described using the MTJ stacks 130', 130", 130''' and 130'''' of FIGS. 4A–4D.

Figure 4A:
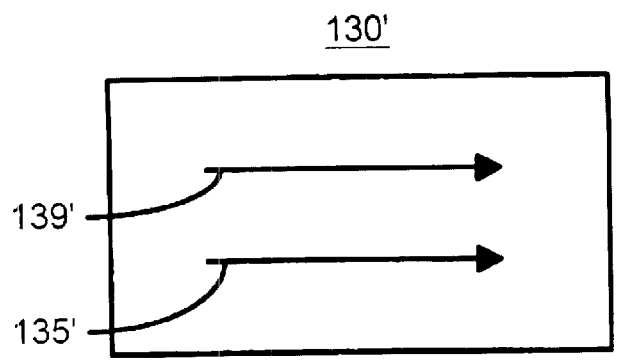
FIGS. 4A–4D depict schematic drawings of a plan view of MTJ stacks and the magnetic vectors of the free layer and the pinned layer in the read out scheme in accordance with present invention.
Figure 4B:
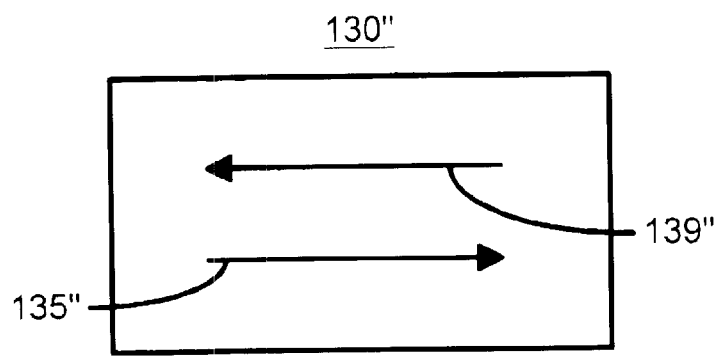

Referring to FIGS. 3, 2, and 4A–4D, the method 200 commences after data has been written to the MTJ stack 130. Thus, the MTJ stack 130 is in equilibrium, in one of two states depicted in FIGS. 4A and 4B. The magnetic vector 139' or 139" of the free layer 138, respectively, lies in the direction of the easy axis (not explicitly shown) of the free layer 138, respectively. FIG. 4A depicts a plan view of the MTJ stack 130' in a low resistance state, in which the magnetic vector 135' of the pinned layer 134 is parallel to the magnetic vector 139' of the free layer 138. FIG. 4B depicts a plan view of the MTJ stack 130" in a low resistance state, in which the magnetic vector 135" of the pinned layer 134 is antiparallel to the magnetic vector 139" of the free layer 138. The states shown of the MTJ stack 130' and 130" in FIGS. 4A and 4B, respectively, thus correspond to the minimum and maximum resistance of the MTJ stack 130, Rmin and Rmax, respectively.

While in equilibrium, the resistance of the MTJ stack 130 is determined, via step 202. When in equilibrium, the MTJ stack 130 is not subjected to the disturb magnetic field, described below. In addition, the MTJ stack 130 is not being written to at equilibrium. Thus, the MTJ stack 130 is in the low resistance state (depicted in FIG. 4A) or the high resistance state (depicted in FIG. 4B). Step 202 preferably includes turning the transistor 113 on so that current can flow through the MTJ stack 130. The measurement of the resistance of the MTJ stack 130 in step 202 can be accomplished by passing a fixed amount of current through the MTJ 130 and measuring the voltage at one end of the MTJ element. The voltage can be detected in step 202 using the sample and hold circuit 140. Alternatively a fixed voltage can be applied across the MTJ stack 130, and the current measured. Thus, the resistance of the MTJ stack 130 can be determined. Note, however, that the voltage or current measured in step 206 could be used as a proxy for the actual resistance of the MTJ stack 130.

Figure 4C:
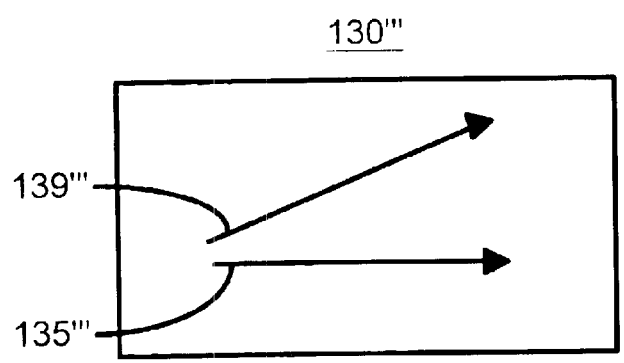
Figure 4D:
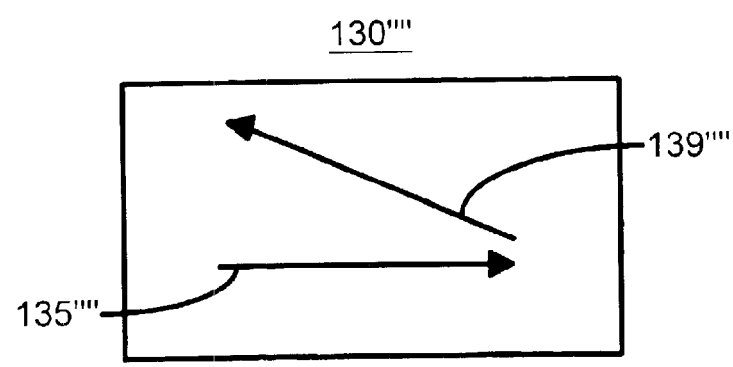

The equilibrium state of the MTJ stack 130 is disturbed, via step 204. In a preferred embodiment, a disturb magnetic field is applied to rotate the magnetic vector of the free layer 138 away from the easy axis in step 204. Step 204 is thus analogous to a write operation. However, the disturb magnetic field applied is preferably insufficient to switch the state of the MTJ stack 130. However, the disturb magnetic field is sufficient to rotate the magnetic vector of the free layer 138 away from its equilibrium position. In a preferred embodiment, the disturb magnetic field is provided by passing a write current through the conductive line(s) 110 and/or 112. However, nothing prevents the disturb magnetic field from being provided in another manner. FIGS. 4C and 4D depict plan views of the MTJ stack 130 (shown as 130''' and 130'''') while under the influence of the disturb magnetic field. FIG. 4C depicts the state of the MTJ stack corresponding to that of FIG. 4A, while FIG. 4D corresponds to that of FIG. 4B. In particular, the state of the MTJ stack 130''' results when the disturb magnetic field is applied to the MTJ stack 130' in a low resistance state, thereby rotating the magnetic vector 139''' of the free layer 138 away from being parallel to the magnetic vector 135''' of the pinned layer 134. Thus, the MTJ stack 130''' has a higher resistance than the MTJ stack 130' in the low resistance state. Similarly, the state of the MTJ stack 130'''' results when the disturb magnetic field is applied to the MTJ stack 130'' in a high resistance state, thereby rotating the magnetic vector 139'''' of the free layer 138 away from being antiparallel to the magnetic vector 135'''' of the pinned layer 134. Thus, the MTJ stack 130'''' has a lower resistance than the MTJ stack 130'' in the high resistance state.

The resistance of the MTJ stack 130 is determined while the state of the magnetic element is disturbed, via step 206. Preferably, step 206 includes determining the resistance of the MTJ stack while disturb magnetic field is applied. The measurement performed in step 206 is preferably performed in the same manner as the measurement is performed for step 202. Thus, step 206 can be accomplished by passing a fixed amount of current through the MTJ 130 and measuring the voltage at one end of the MTJ stack 130 using the sample and hold circuit 140. Alternatively a fixed voltage can be applied across the MTJ stack 130, and the current measured. Note that the voltage or current measured in step 206 could be used as a proxy for the actual resistance of the MTJ stack 130. Thus, the resistance of the MTJ stack 130 while under the influence of the disturb magnetic field can be determined.

The resistance of the MTJ stack 130 taken in step 202 is compared to the resistance of the MTJ stack 130 taken in step 206 (with the disturb magnetic field), via step 208. In one embodiment, step 208 is performed using the data in the sample and hold circuit 140. Step 208 is preferably performed using the comparison circuit 150. However, another component could be used. If the resistance determined in step 206 (with the disturb magnetic field) is higher than the resistance determined in step 204 (without the disturb magnetic field), then the data stored in the MTJ stack 130 correspond to the low resistance state. Thus, in steps 204 and 206, the MTJ stack 130 corresponds to the MTJ stacks 130' and 130''' depicted in FIGS. 4A and 4C, respectively. For example, if a logical zero corresponds to the low resistance state, then the resistance determined in step 206 being higher than the resistance determined in step 204 corresponds to a logical zero. Similarly, if the resistance determined in step 206 (with the disturb magnetic field) is lower than the resistance determined in step 204 (without the disturb magnetic field), then the data stored in the MTJ stack 130 correspond to the high resistance state. Thus, in steps 204 and 206, the MTJ stack 130 corresponds to the MTJ stacks 130'' and 130'''' depicted in FIGS. 4B and 4D, respectively. For example, if a logical one corresponds to the high resistance state, then the resistance determined in step 206 being lower than the resistance determined in step 204 corresponds to a logical one.

The MRAM 100 employing the MTJ stack 130, 130', 130'', 130''' and 130'''' measured using the method 200 exhibits improved reliability. The method 200 avoids comparison of the resistance of a particular magnetic cell using a particular magnetic element (e.g. the MTJ stack 130) with a separate reference element (or groups of elements). The separate reference element(s) have properties and geometries may differ from the magnetic element being measured due to process non-uniformity. These differences are exacerbated for magnetic memories having a higher density and, therefore, smaller magnetic elements. By using resistance of the magnetic element being measured as the reference, the method 200 and MRAM 100 provide a more reliable determination of the state of the magnetic element, particularly at higher magnetic memory densities. Thus, the method 200 and MRAM 100 have improved reliability in readout of stored data.

A method and system has been disclosed for an improved magnetic memory and method for reading a magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reading magnetic memory, the magnetic memory including a plurality of magnetic elements, the method comprising:

(a) determining a first resistance of at least one of the plurality of magnetic elements; and (b) disturbing the at least one of the plurality of magnetic elements;

(c) determining a second resistance of the at least one of the plurality of magnetic elements while the at least one magnetic element is disturbed, the first resistance of the plurality of magnetic elements being determined when the at least one magnetic element is not disturbed; and (d) comparing the first resistance to the second resistance.

2. The method of claim 1 wherein the disturbing step (b) further includes the step of:

(b1) applying a disturb magnetic field to the at least one of the plurality of magnetic elements.

3. The method of claim 2 wherein the second resistance determining step (c) further includes the step of:

(c1) determining the second resistance while the disturb magnetic field is applied, the first resistance of the plurality of magnetic elements being determined in the absence of the disturb magnetic field.

4. The method of claim 2 wherein the plurality of magnetic elements has at least a first state and a second state, wherein the comparing step further includes the step of:

(d1) determining whether the at least one magnetic element is in the first state or the second state based on whether the first resistance is higher than the second resistance.

5. The method of claim 2 wherein each of the plurality of magnetic elements includes a first end and a second end and wherein the first resistance determining step (a) further includes the steps of:

(a1) providing a current through the at least one magnetic element; and (a2) measuring a voltage at the first end of the magnetic element, the first end having a potential that is higher than the second end.

6. The method of claim 5 wherein the magnetic memory further includes a sample and hold circuit and wherein the voltage measuring step (a2) further includes the step of:

(ai1) using the sample and hold circuit to sample and hold the voltage.

7. The method of claim 6 wherein the second resistance determining step (c) further includes the steps of:

(c1) providing the current through the at least one magnetic element; and (c2) measuring a first voltage at the first end of the magnetic element.

8. The method of claim 7 wherein the comparing step (d) further includes the step of:

(d1) using the sample and hold circuit to access the voltage to compare the voltage to the first voltage.

9. The method of claim 2 wherein the first resistance measuring step (a) further includes the steps of:
   (a1) providing a voltage across the at least one magnetic element; and
   (a2) measuring a current through the magnetic element.

10. The method of claim 1 wherein the plurality of magnetic elements further includes a plurality of magnetic tunneling junction stacks.

11. A magnetic memory comprising:
   a plurality of magnetic elements for storing data;
   means for disturbing at least one of the plurality of magnetic elements;
   means for determining a first resistance of at least one of the plurality of magnetic elements without the at least one magnetic element being disturbed and for determining a second resistance while the at least one magnetic element is disturbed; and
   means for comparing the first resistance with the second resistance.

12. The magnetic memory of claim 11 wherein the disturbing means further include:
   means for applying a disturb magnetic field.

13. The method of claim 12 wherein the resistance determining means further include:
   means for determining a first resistance of at least one of the plurality of magnetic elements without the disturb magnetic field and for determining a second resistance in the presence of the disturb magnetic field.

14. The magnetic memory of claim 12 wherein the resistance determining means further includes a sample and hold circuit.

15. The magnetic memory of claim 12 wherein the disturb magnetic field applying means further includes at least one conductive line.

16. A magnetic memory comprising:
   a plurality of magnetic elements:
   at least one conductive line for carrying at least one current; and
   a sample and hold circuit coupled with at least one of the plurality of magnetic elements, the sample and hold circuit for holding a first resistance of at least one of the plurality of magnetic elements, and for sampling a second resistance of the at least one magnetic element, the second resistance being measured while the at least one magnetic element is disturbed, the first resistance being measured while the at least one magnetic element is not disturbed;
   a compare circuit for comparing the first resistance and the second resistance are compared to determine a logical state of the at least one of the plurality of magnetic elements.

17. The magnetic memory of claim 16 wherein the at least one magnetic element is disturbed using a disturb magnetic field and wherein the at least one current further includes at least one disturb magnetic field current for generating the disturb magnetic field.

18. The magnetic memory of claim 17 wherein the plurality of magnetic elements includes a plurality of magnetic tunneling junction stacks.

* * * * *